United States Patent [19]

Smarandoiu et al.

[11] Patent Number: 4,535,259
[45] Date of Patent: Aug. 13, 1985

[54] SENSE AMPLIFIER FOR USE WITH A SEMICONDUCTOR MEMORY ARRAY

[75] Inventors: George Smarandoiu, Palo Alto; George Perlegos, Fremont, both of Calif.

[73] Assignee: Seeq Technology, Inc., San Jose, Calif.

[21] Appl. No.: 389,819

[22] Filed: Jun. 18, 1982

[51] Int. Cl.³ .......................... G11C 7/06; G11C 9/00; G11C 17/04; G11C 11/40
[52] U.S. Cl. .................................... 307/530; 307/468; 365/104; 365/196
[58] Field of Search ............... 307/530, 354, 270, 571, 307/581, 584, 482, 468, 362, 481; 365/103, 104, 195, 196, 208

[56] References Cited

U.S. PATENT DOCUMENTS 4,223,394 9/1980 Pathak et al. .................... 307/530 X
4,443,718 4/1984 Hagiwara et al. ............... 365/104 X

FOREIGN PATENT DOCUMENTS

67332 4/1982 Japan ................................... 307/481

Primary Examiner—Stanley D. Miller
Assistant Examiner—David R. Bertelson
Attorney, Agent, or Firm—Lyon & Lyon

[57] ABSTRACT

A sense amplifier (124) for use in determining the binary state of a selected storage device (4) in a semiconductor memory array (2) is disclosed. The sense amplifier (124) comprises a sensing section (150), a reference signal generator (148), and an inverting amplifier section (152). A relatively small current transistor (164) connected between a source of operating potential (158) and a voltage node (162) in the sensing section (150) supplies read currents to the selected storage device (4) via an enabled bit line (8) in the array (2). A second transistor (168) of relatively large size connected to the voltage node (162) in parallel with the current transistor (164) operates to rapidly raise the potential on the bit line (8) when the bit line (8) is first enabled. A third transistor (166) also of relatively large size connected between the voltage node (162) and the bit line (8) serves as a transfer gate for read currents. The reference signal generator (148) feeds a reference potential $V_{ref}$ to the control gates of the second and third transistors (168, 166), thereby establishing a quiescent bit line potential. The binary state of the selected storage device (4) can then be ascertained by sensing whether the voltage at the voltage node (162) drops in response to current flow through the enabled bit line (8) and selected storage device (4). Any voltage drop at the voltage node (162) which does occur is detected and amplified by the inverting amplifier section (152) of the sense amplifier.

5 Claims, 5 Drawing Figures

SENSE AMPLIFIER FOR USE WITH A SEMICONDUCTOR MEMORY ARRAY

TECHNICAL FIELD

The present invention is directed to a means for detecting the binary state of a selected storage device in a semiconductor memory array and more particularly concerns an amplifier circuit which functions to sense the presence or absence of current flow through the selected storage device during memory array read operations.

BACKGROUND ART

The use of MOS floating gate storage devices in semiconductor memories has increased rapidly in recent years. A typical MOS floating gate storage device includes a floating gate structure disposed over the surface of a semiconductor substrate between spaced-apart source and drain regions. A control gate is then vertically aligned with the floating gate. Programming of the storage device is carried out by applying a potential to the control gate such that charge carriers are transported between the semiconductor substrate and the floating gate, whereupon the threshold voltage in the channel region established between the spaced-apart source and drain regions is modified. During read operations, the presence or absence of charge carriers on the floating gate can be determined by simply measuring the presence or absence of current flow through the channel region in response to voltage potentials applied to the drain region. When floating gate storage devices of the type described above are incorporated in a semiconductor memory array, individual floating gates are utilized for each storage device while a single conductive strip is etched to define the control gates for all of the storage devices in a single memory array row. This single conductive strip is commonly known as a word line. Similarly, the sources of all the storage devices in a memory array column are tied to a single conductive strip commonly known as a bit line. The drains of all the storage devices in the memory array column can either be grounded or tied to a second conductive strip running parallel to the bit line. The latter conductive strip is known as a write line and is used in conjunction with EEPROM storage devices such as those disclosed in co-pending application Ser. No. 343,847 filed Jan. 29, 1982.

The memory array is prepared for programming or read operations by enabling the word line of a particular memory array row using a unique x-address applied to the address inputs of the memory array and by simultaneously enabling the bit line of a particular memory array column using a unique y-address also applied to the memory array address inputs. Thereafter, charge carriers can be transported to the floating gate of the storage device located at the intersection of the enabled word and bit lines through application of the aforementioned programming potential to the enabled word line. Alternately, the presence or absence of charge carriers on the floating gate of the storage device can be determined by connecting the enabled bit line to a source of read potential and then sensing whether current flows along the bit line through the storage device channel region. Current flow, it will be recalled, indicates that charge carriers are not present on the floating gate whereas the absence of current flow indicates that charge carriers have been placed on the floating gate.

In order to determine whether current is flowing through an enabled bit line, and hence through a selected storage device connected to the enabled bit line, semiconductor memory arrays conventionally employ a sense amplifier to detect changes in bit line voltage and/or current levels. Although a variety of sense amplifier schemes may be utilized for this purpose, all such schemes are subject to several constraints. Specifically, an individual storage device in an unprogrammed state draws a minimal amount of current, generally on the order of 5 $\mu a$. Thus, the sense amplifier current source supplying the enabled bit line must be small enough to furnish the required current without overloading the individual storage device. On the other hand, the relatively large number of storage devices connected to the same bit line effectively places a cumulative capacitance of relatively large magnitude on the sense amplifier, which cumulative capacitance is progressively discharged as word lines associated with storage devices other than the selected storage device are enabled during memory array read operations. If the sense amplifier current source is to provide current flow on the enabled bit line within the time constraints of practical semiconductor memory operation, an additional source of relatively large potential capable of rapidly charging the enabled bit line prior to reading the selected storage device is required. It is accordingly necessary to strike a balance between the competing demands of minimal current flow and rapid charge capacity when designing a sense amplifier for use with a semiconductor memory array.

DISCLOSURE OF THE INVENTION

It is therefore the object of the present invention to provide an amplifier for sensing the binary state of a selected storage device connected to an enabled bit line in a semiconductor memory array.

It is another object of the present invention to provide an amplifier for sensing voltage drops at a voltage node connected to an enabled bit line of a semiconductor memory array in order to determine whether current is flowing through the enabled bit line to a selected storage device in the array.

It is still a further object of the present invention to provide a sense amplifier for supplying a selected storage device connected to an enabled bit line in a semiconductor memory array with adequate current during memory array read operations while simultaneously maintaining the bit line voltage at a level sufficient to support the current flow despite any voltage discharge which has otherwise occurred along the bit line as a result of previous memory array read or programming operations.

These and other objects of the present invention are achieved in a sense amplifier comprising a sensing section, a reference signal generator and an inverting amplifier section. The sense amplifier sensing section includes a relatively small current transistor connected between a source of operating potential and a voltage node. The current transistor supplies a selected storage device connected to an enabled bit line in a semiconductor memory array with a read current having a magnitude adequate to perform the memory array read operation but not large enough to overload the selected storage device. The sense amplifier sensing section also includes a larger voltage transistor connected in parallel with the current transistor between the source of operating voltage and the voltage node. The voltage transistor rapidly raises the bit line potential to an acceptable level when the bit line is first enabled. A third transistor also of relatively large size connected between the voltage node and the bit line serves as a transfer gate for read currents. The sense amplifier reference signal generator feeds the control gates of the voltage transistor and the transfer gate with a reference potential $V_{ref}$ to establish the quiescent bit line potential. The programmed or non-programmed state of the selected storage device can then be ascertained by sensing whether the voltage at the sensing section voltage node drops in response to current flow through the enabled bit line and selected storage device. Any voltage drop at the voltage node which does occur is detected and amplified by the inverting amplifier section of the sense amplifier. The inverting amplifier section may specifically include a three-stage single-ended amplifier functioning as an inverter, whereby sharp transistions between the memory array logical one state and the memory array logical zero state are achieved in response to relatively small shifts in voltage at the sensing section voltage node.

BRIEF DESCRIPTION OF THE DRAWINGS

The various features, objects and advantages of the present invention will become more apparent upon consideration of the following Brief Description of the Drawings and Best Mode for Carrying Out the Invention, wherein.

BEST MODE FOR CARRYING OUT THE INVENTION

Figure 1:
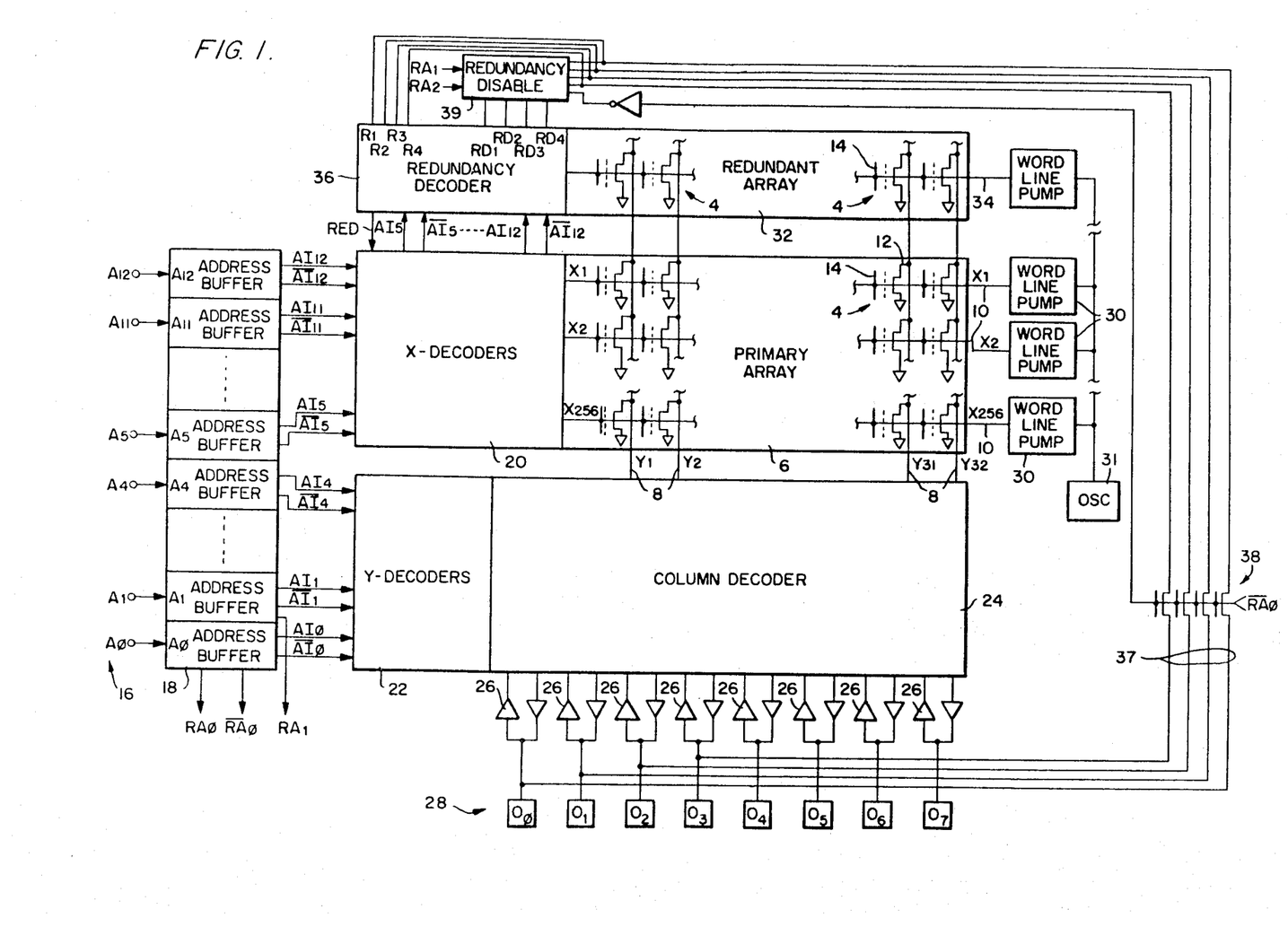
FIG. 1 is a schematic representation of a semiconductor memory comprising floating gate storage devices arranged along primary and redundant word lines to form primary and redundant arrays.

FIG. 1 schematically illustrates a semiconductor memory having a plurality of MOS storage devices 4 arranged to form a primary array 6. Each of the storage devices 4 may comprise an electrically-programmable read-only floating gate structure of the type disclosed in U.S. Pat. No. 4,288,256. A series of bit lines 8 arranged in columns and primary word lines 10 arranged in rows are respectively connected to the storage device drains 12 and control gates 14, whereby each storage device may be individually programmed and read in accordance with a unique storage device address. Specifically, primary word lines 10 serve to define the x-addresses of the storage devices while bit lines 8 serve to define the storage device y-addresses. Thus, in a 64k-bit embodiment, memory 2 includes two hundred and fifty-six primary word lines designated $X_1, X_2 \ldots X_{256}$ and two hundred and fifty-six bit lines designated $Y_1, Y_2 \ldots Y_{256}$. If desired, the bit lines can be subdivided into eight groups of 32 bit lines each to enable the simultaneous storage of an 8-data bit word, i.e., a data byte, using only a single y-address. In the latter event, each of the eight bit lines activated by the single y-address may be arranged in interleaved fashion.

Programming or reading of a particular storage device, or set of storage devices where bit lines 8 are divided into interleaved groups, is initiated by applying a digital address signal $A_0, A_1 \ldots A_n$ to a series of address bit inputs 16. In the interleaved 64k-bit embodiment of memory 2 described above, the first five address bits $A_0$–$A_4$ establish the particular y-address $Y_1, Y_2 \ldots Y_{32}$ of each data byte while an additional eight address bits $A_5$–$A_{12}$ establish the data byte x-address $A_1, X_2 \ldots X_{256}$. Address bit inputs 16 respectively feed the address bits $A_0$–$A_{12}$ to a series of address buffers 18. Each of the address buffers in turn generates an address indicator $AI_i$ and an inverted address indicator $\overline{AI}_i$ for use in decoding the address signal. That is, the output of the address buffers 18 which receive address bits $A_0$–$A_4$ comprise a series of address indicators $AI_0$–$AI_4$ and inverted address indicators $\overline{AI}_0$–$\overline{AI}_4$, whereas the output of the address buffers 18 which receive address bits $A_5$–$A_{12}$ comprise a series of address indicators $AI_5$–$AI_{12}$ and inverted address indicators $\overline{AI}_5$–$\overline{AI}_{12}$. Address indicators $AI_5$–$AI_{12}$ and inverted address indicators $\overline{AI}_5$–$\overline{AI}_{12}$ are supplied to X-decoders schematically illustrated at 20 and are combined in a digital logic system to enable the specific primary word line 10 associated with the x-address established by address bits $A_5$–$A_{12}$. Simultaneously, the address indicators $AI_0$–$AI_4$ and inverted address indicators $\overline{AI}_0$–$\overline{AI}_4$ are supplied to Y-decoders illustrated schematically at 22. The Y-decoders operate in conjunction with a column decoder 24, combining the various address and inverted address indicators in a digital logic system such that selected bit lines 8 associated with the y-address established by data bits $A_0$–$A_4$ are enabled.

Data is programmed into or read out of primary array 6 by connecting each enabled bit line 8 to the appropriate one of a pair of input/output buffers 26 respectively tied to output pads 28 and then entering or reading out the appropriate data bit $O_0$–$O_7$. As further disclosed in co-pending application Ser. No. 346,159 filed Feb. 5, 1982 and incorporated herein by reference, the time required to program individual storage devices 4 in primary array 6 can be significantly reduced by increasing the programming voltage present on the primary word lines 10 associated with the individual storage devices 4. To this end, a series of word line charge pumps 30 driven by a high voltage oscillator 31 are respectively connected to primary word lines 10 in order to raise the voltages thereof to a predetermined level during memory programming operations.

Memory 2 is additionally provided with a redundant array 32 of storage devices 4 arranged along redundant word lines 34 for the purpose of providing back-up memory capacity should any of the primary word lines 10 in primary array 6 prove faulty, i.e., should any of the storage devices 4 associated with primary word lines 10 contain manufacturing defects. The redundant word lines 34 are connected to the control gates 14 of storage devices 4 to establish alternate x-addresses for the memory. When a faulty word line is present at a particular x-address in primary array 6, address indicators $AI_5$–$AI_{12}$ and inverted address indicators $\overline{AI}_5$–$\overline{AI}_{12}$ generated by address buffers 18 as a function of the address bits $A_5$–$A_{12}$ corresponding to the x-address of the faulty primary word line are used to program a redundancy decoder 36 such that any subsequent address signal $A_0$–$A_{12}$ having the x-address of the faulty word line in primary array 6 will instead enable a selected redundancy word line 34 in redundancy array 32. A series of control signals supplied to redundancy select lines 37 via the output pads 28 associated with data bits $O_0$–$O_3$ are gated through a set of redundancy enable transistors 38 to assist in programming redundancy decoder 36. Once a particular x-address has been transferred from primary array 6 to redundant array 32, a redundancy disable circuit 39 prevents any accidental reprogramming of redundancy decoder 36 relative to the selected redundant word line 34 enabled by the particular x-address. The redundancy disable circuit also generates a redundancy disable signal $RD_1$–$RD_4$ indicative of the fact that the selected redundant word line is in use, which redundancy disable signal can be supplied back through redundancy enable transistors 38 to an appropriate output pad 28. A more detailed explanation of the structure and function of redundant array 32, redundancy decoder 36 and redundancy disable circuit 39 can be found in co-pending application Ser. No. 367,331 filed Apr. 12, 1982, and incorporated herein by reference.

Figure 2:
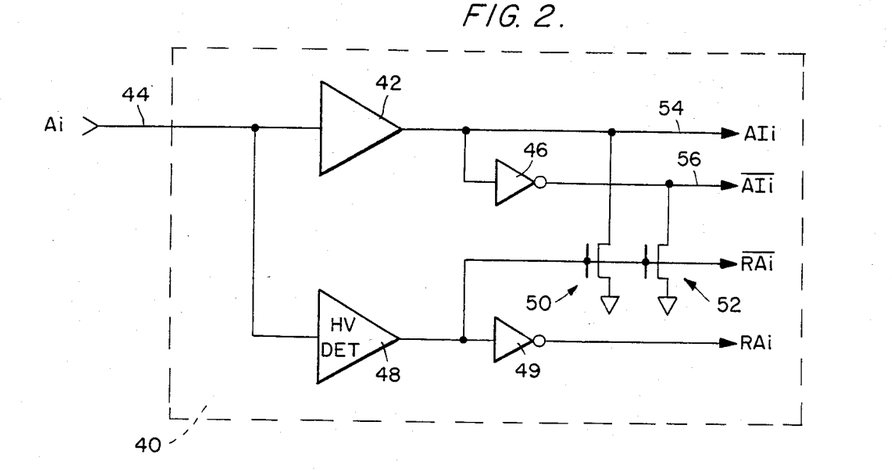
FIG. 2 is a circuit diagram of a dual-function address buffer capable of generating address and inverted address indicators and control signals for use in the semiconductor memory of the present invention.

The address buffers 18 employed in the memory 2 of the present invention may be constructed with a dual function capability, providing control signals for governing the operation of various peripheral circuits of the memory in addition to the aforementioned address and inverted address indicators $AI_0$–$AI_{12}$, $\overline{AI}_0$–$\overline{AI}_{12}$. Turning to FIG. 2, a representative address buffer 40 can be seen, it being understood that all of the address buffers 18 of FIG. 1 are similarly constructed. Address buffer 40 includes a conventional buffer/amplifier circuit 42 which receives an incoming address bit $A_i$ via input lead 44 and outputs an address indicator $AI_i$ in response thereto. The address indicator $AI_i$ switches either high or low depending upon whether address bit $A_i$ is a binary zero or a binary one. An inverter 46 connected to the output of buffer/amplifier circuit 42 provides the inverted address indicator $\overline{AI}_i$. The value of inverted address indicator $\overline{AI}_i$ is, of course, low whenever the value of address indicator $AI_i$ is high and vice versa. Address buffer 40 further includes a high voltage detector 48 which detects high voltage inputs to the address buffer, i.e., voltages significantly greater than the TTL voltages employed in conjunction with address bits $A_i$. The high voltage detector output comprises an inverted control signal $\overline{RA}_i$ which may be used for control purposes by other peripheral circuits in memory 2. Inverted control signal $\overline{RA}_i$ is passed through an inverter 49 to produce control signal $RA_i$, and is simultaneously supplied to the control gates of pull-down transistors 50, 52 respectively connected across address indicator and inverted address indicator leads 54, 56. The address buffer of the present invention thus operates in two modes. When normal TTL voltages in the form of $A_i$ address bits are present on input lead 44, address buffer 40 outputs an address indicator $AI_i$ and an inverted address indicator $\overline{AI}_i$ having complementary values determined in accordance with the binary state of address bit $A_i$. When, however, a high voltage signal (e.g., 15 v.) is applied to the input lead 44, the inverted control signal $\overline{RA}_i$ from high voltage detector 48 switches high to perform the aforementioned peripheral control functions, the control signal $RA_i$ from inverter 49 switches low to perform other peripheral control functions and pull-down transistors 50 and 52 are gated into conduction by inverted control signal $\overline{RA}_i$ to disable the address and inverted address indicators $AI_i$, $\overline{AI}_i$.

It will be recalled that the interleaved 64k-bit embodiment of memory 2 is characterized by thirty-two y-addresses $Y_1$–$Y_{32}$ established in response to the first five address bits $A_0$–$A_4$ of the digital address signal $A_0$–$A_{12}$ input to address buffers 18. The bit lines 8 of memory 2 are correspondingly divided into eight groups of thirty-two bit lines each such that one bit line from every group of thirty-two bit lines will be enabled by a given y-address. As will be described in greater detail below, each group of thirty-two bit lines in memory 2 is further sub-divided into two sub-groups of sixteen bit lines. Accordingly, the first four address bits $A_0$–$A_3$ are utilized to access a selected one of the bit lines in each sub-group of sixteen bit lines while the remaining $A_4$ address bit is employed to access one of the two sub-groups of sixteen bit lines in each thirty-two bit line group. Y-decoders 22 receive the four address indicators $AI_0$–$AI_3$ and inverted address indicators $\overline{AI}_0$–$\overline{AI}_3$ output from the $A_0$–$A_3$ address buffers. The address and inverted address indicators are thereafter processed by the Y-decoders to generate sixteen y-select signals $YS_1$, $YS_2$ ... $YS_{16}$ which respectively access the aforementioned one of sixteen bit lines in each sub-group of sixteen bit lines. Concurrently, the $AI_4$ address indicator and the $\overline{AI}_4$ inverted address indicator output from the $A_4$ address buffer are directed to column decoder 24 for use in accessing the aforementioned one of the two bit line sub-groups in each group of thirty-two bit lines.

Figure 3:
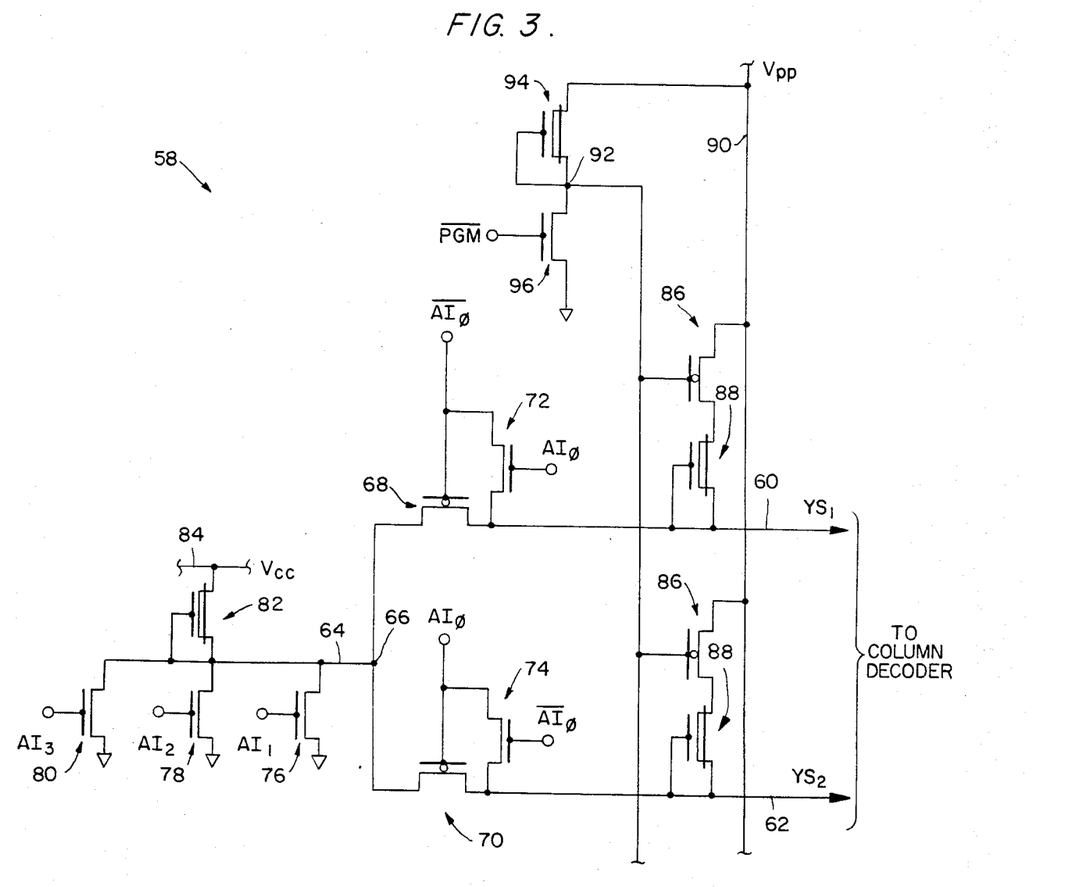
FIG. 3 illustrates a representative Y-decoder for use with the semiconductor memory array of the present invention.

Turning to FIG. 3, a representative Y-decoder 58 is illustrated. Y-decoder 58 specifically generates the $YS_1$ and $YS_2$ y-select signals. To this end, Y-decoder 58 includes a y-select line 60 and a y-select line 62 tied to a common lead 64 via voltage node 66. Zero-threshold devices 68 and 70 are respectively connected across y-select lines 60 and 62. A pair of enhancement-mode devices 72 and 74 are in turn respectively connected between the y-select lines and the control gates of zero-threshold devices 68 and 70. The control gate of zero-threshold device 68 receives the $\overline{AI}_0$ inverted address indicator while the control gate of enhancement-mode device 72 receives the $AI_0$ address indicator. The $AI_0$ address indicator is also supplied to the control gate of zero-threshold device 70, while the control gate of enhancement-mode device 74 receives the inverted address indicator $\overline{AI}_0$. A series of enhancement-mode devices 76, 78 and 80 are all connected in pull-down configuration between common lead 64 and ground. A depletion-mode device 82 is connected in pull-up configuration between lead 64 and an operating voltage supply line 84 carrying operating voltage $V_{cc}$. The control gates of enhancement-mode devices 76–80 respectively receive the $AI_1$, $AI_2$ and $AI_3$ address indicators.

During operation of Y-decoders 22, the binary states of the $A_0$–$A_3$ address bits input to address buffers 18 determine which of the y-select signals $YS_1$–$YS_{16}$ will be generated. In the Y-decoder 58, for example, a "0000" value for the $A_0$–$A_3$ address bits will result in the generation of a high $YS_1$ signal on the y-select line 60. This result follows from the fact that the $AI_0$–$AI_3$ address indicators output from address buffers 18 are all low when the $A_0$–$A_3$ address bits are zero. Consequently, enhancement-mode devices 76–80 will be rendered non-conductive and the voltage at voltage node 66 will be raised to $V_{cc}$ by the pull-up action of depletion-mode device 82. Zero-threshold device 68, on the other hand, will be rendered conductive by the high $\overline{AI_0}$ inverted address indicator output from address buffers 18 when the $A_0$ address bit is zero, transferring the voltage $V_{cc}$ from voltage node 66 to the y-select line 60. Simultaneously, zero-threshold device 70 will be rendered non-conductive by the low voltage $AI_0$ address indicator supplied to the control gate of zero-threshold device 70 while enhancement-mode device 74 conducts in response to the high $\overline{AI_0}$ inverted address indicator. The $AI_0$ address indicator potential is thus applied to the y-select line 62, ensuring that the y-select signal $YS_2$ remains at a low value. In contrast, where the $A_0$–$A_3$ address bits input to address buffers 18 have a "1000" value, the resulting high $AI_0$ address indicator and low or zero $\overline{AI_0}$ inverted address indicator will combine to gate the $V_{cc}$ voltage at voltage node 66 through zero-threshold device 70 to generate a high y-select signal $YS_2$ on the y-select line 62 while driving the voltage, and hence the y-select signal $YS_1$, on the y-select line 60 to zero.

Although FIG. 3 specifically illustrates circuitry for generating the $YS_1$ and $YS_2$ y-select signals, it is understood that structurally similar circuitry receiving other logical permutations of the $AI_0$–$AI_3$ address indicators and $\overline{AI_0}$–$\overline{AI_3}$ inverted address indicators may be employed by Y-decoders 22 to generate the remaining y-select signals $YS_3$–$YS_{16}$.

As described in connection with FIG. 4 below, the various y-select signals $YS_1$–$YS_{16}$ are used to gate transistors connected across the bit lines in each sub-group of sixteen bit lines. During programming of the storage devices 4 in memory array 2, it is necessary to apply a relatively high potential to the selected bit lines in the various sub-groups of sixteen bit lines. Such high programming potentials require that the y-select transistors connected to the bit lines be heavily gated on during programming. In order to achieve this heavy gating, the potential on the various y-select lines must be increased above the operating voltage $V_{cc}$ supplied by operating voltage supply line 84 in the Y-decoder circuitry of FIG. 3. Accordingly, the FIG. 3 circuitry includes two pairs of series-connected transistors 86, 88 arranged in pull-up configuration between a programming voltage supply line 90 carrying programming voltage $V_{pp}$ and the y-select lines 60, 62. Each transistor 86 is a zero-threshold device and each transistor 88 is a depletion-mode device. The control gates of the zero-threshold devices 86 are connected to a voltage node 92. A pull-up styled depletion-mode device 94 interconnects voltage node 92 with programming voltage supply line 90, while an enhancement-mode device 96 is connected in pull-down configuration to voltage node 92. The control gate of enhancement-mode device 96 receives an inverted programming signal $\overline{PGM}$ of the type frequently employed with programmable read-only memories. Under non-programming conditions, $\overline{PGM}$ is high and voltage node 92 is grounded to inactivate the zero-threshold devices 86, leaving the potential of the y-select lines 60 and 62 unaffected. When programming of memory 2 is to be performed, however, the inverted programming signal $\overline{PGM}$ is driven low to remove the ground from voltage node 92, permitting depletion-mode device 94 to transfer the programming voltage $V_{pp}$ from programming voltage supply line 90 to the gates of the zero-threshold devices 86. The zero-threshold devices 86 are subsequently gated into conduction and the programming voltage $V_{pp}$ is supplied in pull-up fashion to the y-select lines 60 and 62. Either y-select line pulled down to zero voltage due to the aforementioned conduction of enhancement-mode devices 72 or 74 will remain at a zero potential, but if one of the y-select lines has instead been supplied with operating voltage $V_{cc}$ to generate the high y-select signal $YS_1$ or $YS_2$, the y-select line so supplied will be driven to the $V_{pp}$ voltage level by the action of the zero-threshold devices 86 connected thereto. In this manner, the potential of the y-select signal $YS_1$ or $YS_2$ will be sufficient to ensure accurate programming of the selected memory device along the bit line enabled by the $YS_1$ or $YS_2$ y-select signal.

Figure 4:
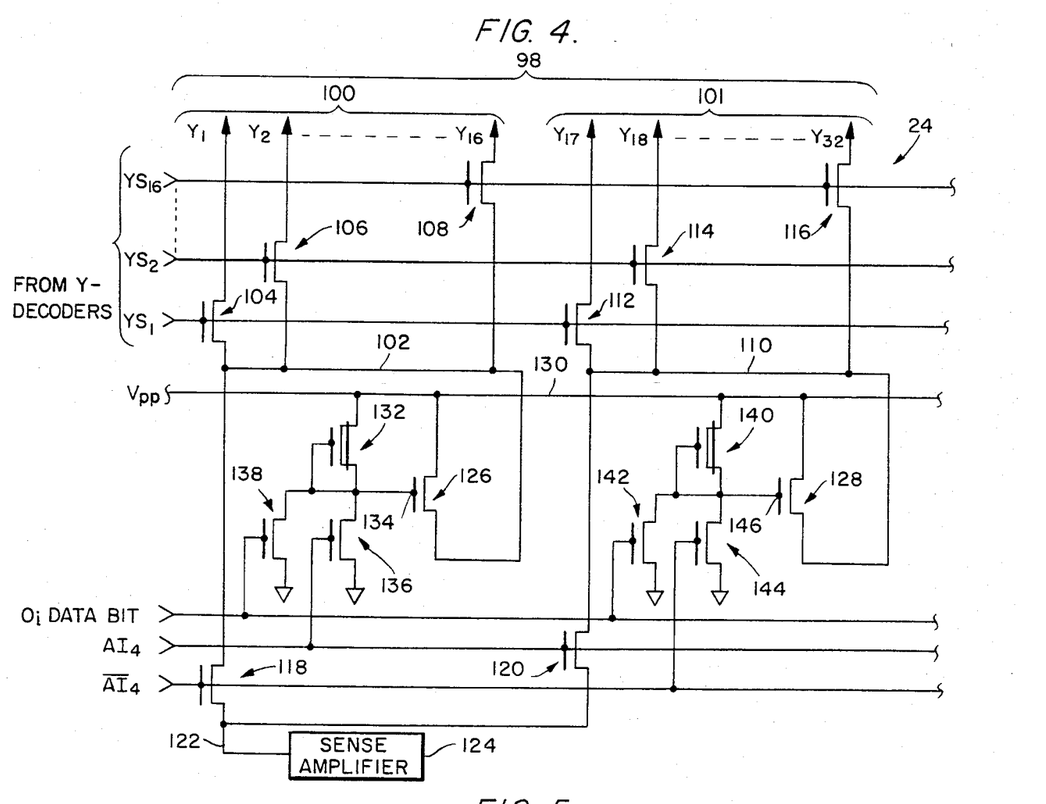
FIG. 4 is a circuit diagram of a representative portion of the column decoder employed in conjunction with the Y-decoder of FIG. 2 to enable selected bit lines of the semiconductor memory array in accordance with the y-address input to the memory array.

A representative portion of the column decoder 24 employed in memory array 2 is illustrated in detail in FIG. 4. Column decoder 24 operates in conjunction with Y-decoders 22 to enable selected bit lines 8 as a function of the y-address established by data bits $A_0$–$A_4$. As previously noted, where memory 2 comprises a 64k-bit memory designed to store a data byte (e.g., an eight-data bit word) using only a single y-address, bit lines 8 are divided into eight groups of thirty-two bit lines each. As also previously noted, each group of thirty-two bit lines is further sub-divided into two sub-groups of sixteen bit lines each. One bit line in each group of thirty-two bit lines can then be enabled for each y-address $Y_i$ input to address buffers 18 by first accessing one bit line in each sub-group of sixteen bit lines and then accessing one sub-group in each group of thirty-two bit lines.

In the column decoder of FIG. 4, the bit lines 8 respectively associated with y-addresses $Y_1, Y_2 \ldots Y_{32}$ are consecutively arranged to form the eight groups 98 of thirty-two bit lines each such that the eight bit lines associated with each $Y_i$ address are interleaved. The first sixteen bit lines $Y_1$–$Y_{16}$ in each group 98 for a first sub-group 100 of sixteen bit lines and the next sixteen bit lines $Y_{17}$–$Y_{32}$ in each group 98 form a second sub-group 101 of sixteen bit lines. Bit lines $Y_1$–$Y_{16}$ of sub-group 100 are respectively connected through a series of column-select transistors to a sub-group lead 102. In the interests of clarity, only three such column-select transistors 104, 106 and 108 are shown in FIG. 4. The remaining $Y_{17} \ldots Y_{32}$ bit lines of sub-group 101 are connected through a similar series of column-select transistors to a sub-group lead 110. Again, only three such column-select transistors 112, 114 and 116 are shown. The control gates of corresponding column-select transistors from each sub-group 100 and 101 are connected in common to receive one of the y-select signals $YS_1$–$YS_{16}$ from the Y-decoders 22. That is, the control gates of column-select transistors 104 and 112 both receive the $YS_1$ y-select signal, the control gates of column-select transistors 106 and 114 both receive the $YS_2$ y-select signal, and so on.

Sub-group leads 102 and 110 are respectively connected through additional column-select transistors 118 and 120 to a sense line 122. Sense line 122 is connected to the sense amplifier 124 of the present invention, disclosed in greater detail in FIG. 5 below, for use during memory array read operations. Unlike the column-select transistors such as transistors 104 and 112 in the bit line sub-groups, the control gates of column-select transistors 118 and 120 are not commonly connected. Rather, the control gate of column-select transistor 118 receives the inverted address indicator $\overline{AI}_4$ from the $A_4$ address buffer and the control gate of column-select transistor 120 receives the address indicator $AI_4$ from the $A_4$ address buffer. It can therefore be seen that one bit line in each group 98 of thirty-two bit lines will be enabled for reading, i.e., connected to sense line 122, for each y-address input to memory 2. One of the column-select transistors 104–108 and 112–116 in each sub-group 100 or 101 of bit lines is gated by the associated y-select signal $YS_1$–$YS_{16}$ output from the Y-decoders 22 in accordance with the $A_0$–$A_3$ address bits supplied to the $A_0$–$A_3$ address buffers 18, and either column-select transistor 118 or column-select transistor 120 is gated into conduction by the address indicators $AI_4$, $\overline{AI}_4$ from the $A_4$ address buffer 18 depending upon the binary state of the $A_4$ address bit supplied to the $A_4$ address buffer. For example, where the y-address bits $A_0$–$A_4$ furnished to address bit inputs 16 have a value of "00000", y-decoder 22 will generate a high $YS_1$ y-select signal using the $AI_0$–$AI_3$ address indicators and $\overline{AI}_0$–$\overline{AI}_3$ inverted address indicators as described in conjunction with FIG. 3. The high $YS_1$ y-select signal gates column-select transistors 104 and 112. At the same time, the "0" value of the $A_4$ address bit will cause the $A_4$ address buffer 18 to generate a low $AI_4$ address indicator together with a high $\overline{AI}_4$ inverted address indicator as described in conjunction with FIG. 2. Column-select transistor 118 will then be gated into conduction while column-select transistor 120 remains in an off condition. As a net result, the $Y_1$ bit line in group 98 is connected to sense line 122 and a selected one of the storage devices 4 having drains 12 connected to the $Y_1$ bit line can be read. Alternately, if the $A_0$–$A_4$ address bits furnished to address bit inputs 16 have a value of "00001", the column-select transistors 104 and 112 will still be gated by a high $YS_1$ y-select signal but the ensuing low $\overline{AI}_4$ inverted address indicator together with the high $AI_4$ address indicator will now bias the column-select transistor 120 into conduction while shutting the column-select transistor 118 off, connecting the $Y_{17}$ bit line in group 98 rather than the $Y_1$ bit line to sense line 122 in preparation for reading a selected storage device tied to the $Y_{17}$ bit line.

Programming of a selected memory device 4 along a selected $Y_1$–$Y_{32}$ bit line is accomplished by switching on either of two programming transistors 126 or 128. More particularly, programming transistor 126 is connected between sub-group lead 102 and a programming voltage supply line 130 carrying programming voltage $V_{pp}$. Programming transistor 128 is connected between sub-group lead 110 and programming voltage supply line 130. Programming transistor 126 can be biased into conduction by a depletion-mode device 132 connected in pull-up configuration between programming voltage supply line 130 and the control gate 134 of programming transistor 126. A pair of enhancement-mode pull-down devices 136 and 138 are also connected to the control gate 134 of programming transistor 126 such that conduction of either pull-down device 136 or 138 grounds control gate 134 and shuts programming transistor 126 off. The control gates of pull-down devices 136 and 138 are respectively connected to receive the $AI_4$ address indicator from the $A_4$ address buffer 18 and a data signal from the input/output buffer 26 (not shown in FIG. 4) associated with the $0_i$ data bit. In an analogous fashion, depletion-mode pull-up device 140 and a pair of enhancement-mode pull-down devices 142 and 144 are tied to the control gate 146 of programming transistor 128 to govern the conduction thereof. The control gate of pull-down device 142 receives the $0_i$ data bit from the input/output buffer 26, but the control gate of pull-down device 144 receives the inverted address indicator $\overline{AI}_4$ from the $A_4$ address buffer rather than the address indicator $AI_4$.

When a particular memory device 4 along a selected bit line in group 98 is to be programmed, the y-address of the memory device is furnished to address inputs 16 and the corresponding y-select signal $YS_i$ is generated in response to the $AI_0$–$AI_3$ and $\overline{AI}_0$–$\overline{AI}_3$ address and inverted address indicators as disclosed hereinabove to gate the appropriate one of the column-select transistors 104–108 and 112–116 in each sub-group 100, 101 of sixteen bit lines. Simultaneously, the complementary values of the $AI_4$ and $\overline{AI}_4$ address and inverted address indicators will act to bias one of the two pull-down devices 136 and 144 on while rendering the other of the two pull-down devices non-conductive. The control gate 134 or 146 tied to the conducting pull-down device 136 or 144 will be grounded to turn the associated programming transistor 126 or 128 off. The remaining control gate cannot be grounded through the non-conductive pull-down device 136 or 144 tied thereto, and the programming transistor associated with the remaining control gate is consequently gated into conduction depending upon the value of the $0_i$ data bit. If $0_i$ is low, i.e., has a "zero" value, pull-down devices 138 and 142 will also be rendered non-conductive to remove the last ground from the remaining control gate, whereupon depletion-mode device 132 or 140 will operate to raise the voltage on the remaining control gate and bias the associated programming transistor into conduction. The programming voltage $V_{pp}$ on programming voltage supply line 130 is thereafter transferred from the programming voltage supply line 130 through the appropriate sub-group lead 102 or 110 and the gated column-select transistor in the corresponding series of column-select transistors 104–108 or 112–116 to the selected $Y_i$ bit line, enabling programming of the selected memory device 4 along the $Y_i$ bit line. If the $0_i$ data bit has a "one" value, both pull-down devices 138 and 142 will be biased on to ground the control gates 134 and 146 of programming transistors 126 and 128 without regard to whether pull-down device 136 or 144 is conducting and the programming voltage $V_{pp}$ will be prevented from reaching the selected $Y_i$ bit line. It should here be noted that, due to the complementary nature of the $AI_4$ and $\overline{AI}_4$ address and inverted address indicators, the column-select transistor 118 or 120 connected to the sub-group lead 102 or 110 receiving the programming voltage $V_{pp}$ will itself be supplied with a high gate drive signal. This high gate drive signal will, however, not result in the conduction of the column-select transistor 118 or 120, inasmuch as the magnitude of $V_{pp}$ is greater than the magnitude of either the $AI_4$ or $\overline{AI}_4$ signal and the gate-to-source voltage on column-select transistors 118 or 120 will always be less than zero.

In order to more fully appreciate the programming operation of column decoder 24, the following example is given. Where the $0_i$ data bit is to be stored at the $Y_1$ address location, the "00000" or $Y_1$ address is furnished to address bit inputs 16 and the "0000" $A_0$–$A_3$ address bits will cause the Y-decoders 22 (not shown in FIG. 4) to output a $YS_1$ y-select signal. The high $YS_1$ signal, it will be recalled, gates column-select transistors 104 and 112 on. The "0" $A_4$ address bit will produce a high $\overline{AI}_4$ inverted address indicator, bringing pull-down device 144 into conduction and grounding control gate 146 to shut programming transistor 128 off. Concomitantly, the low $AI_4$ address indicator generated in response to the "0" $A_4$ address bit will render pull-down device 136 non-conductive to remove one source of ground from the control gate 134 of programming transistor 126 associated with the $Y_1$ bit line. The aforementioned value of the $0_i$ data bit will then determine whether the programming voltage $V_{pp}$ is transferred through programming transistor 126, sub-group lead 102 and column-select transistor 104 to the $Y_1$ bit line. That is, where $0_i$ has a binary "zero" value, pull-down device 138 is turned off and programming transistor 126 conducts to place the programming voltage $V_{pp}$ on the $Y_1$ bit line. The programming voltage, of course, causes transfer of charge carriers between the storage device channel region and the floating gate of the storage device, increasing the storage device threshold voltage beyond the value at which current flow through the selected storage device channel is produced when a read or sense voltage is applied to the storage device control gate. When $0_i$ is a binary one, pull-down device 138 conducts to ground control gate 134 and shut programming transistor 126 off. In the latter event, no programming voltage reaches the $Y_1$ bit line and no charge carriers are transported between the channel region and floating gate of the selected storage device. With the floating gate free of charge carriers, the threshold voltage of the selected storage device is lowered sufficiently to permit current flow through the storage device channel region when the read voltage is applied to the storage device control gate.

Continuing the illustrative example of column decoder operation, where the $0_i$ data bit is to be stored at the $Y_{17}$ address location, the "00001" or $Y_{17}$ address is furnished to address bit inputs 16. The "0000" $A_0$–$A_3$ address bits again result in a high $YS_1$ y-select signal and column-select transistors 104 and 112 are again gated on. The "1" $A_4$ address bit nevertheless reverses the conduction order of the programming transistors 126 and 128, producing a high $AI_4$ address indicator which switches pull-down device 136 on to ground control gate 134 and shut programming transistor 126 off. Instead, pull-down device 144 is rendered non-conductive by the low $\overline{AI_4}$ inverted address indicator to remove one source of ground from the control gate 146 of programming transistor 128. The conductive state of remaining pull-down device 142 determines the conductive state of programming transistor 128 as a function of the binary value of the $0_i$ data bit. Programming voltage $V_{pp}$ is transferred to the enabled $Y_{17}$ bit line when the $0_i$ data bit is a binary "zero" and blocked from the enabled $Y_{17}$ bit line when $0_i$ is a binary "one".

Figure 5:
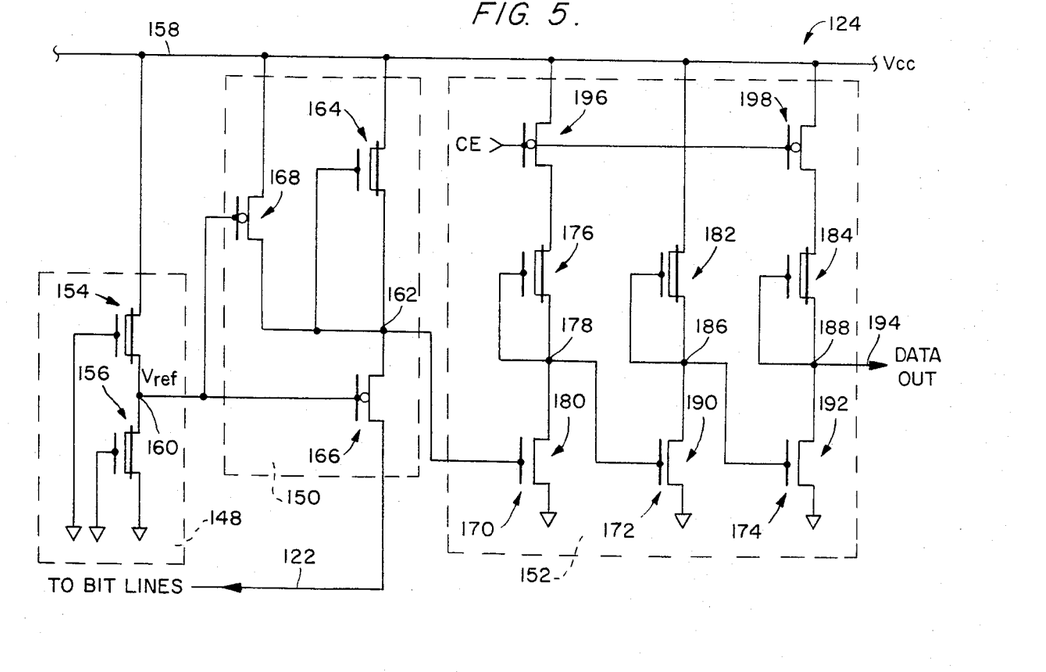
FIG. 5 is a circuit diagram of the sense amplifier employed to detect the presence or absence of current flow through a selected storage device in the semiconductor memory array during memory array read operations.

Turning to FIG. 5, a representative sense amplifier 124 of the present invention can be seen. One such sense amplifier is utilized for each group 98 of thirty-two bit lines in the column decoder of FIG. 4. The sense amplifier functions during memory read operations to detect the presence or absence of current flow through a selected storage device connected to an enabled $Y_i$ bit line, thereby determining the binary state of the selected storage device. Sense amplifier 124 basically consists of a reference signal generator 148, a sensing section 150 and an inverting amplifier section 152. The reference signal generator, which provides a reference voltage $V_{ref}$ for sense amplifier 124, comprises a pair of depletion-mode devices 154, 156 connected in series between ground and an operating voltage supply line 158 carrying operating voltage $V_{cc}$. The control gates of both depletion-mode devices 154 and 156 are also grounded. Hence, depletion-mode devices 154 and 156 conduct until the voltage $V_{ref}$ at node 160 between the two devices reaches a level equal to approximately half that of the supply line voltage $V_{cc}$. In actual practice, the width-to-length channel ratio of device 154 is somewhat smaller than the width-to-length channel ratio of device 156 and the threshold voltage of device 154 is correspondingly larger than the threshold voltage of device 156, causing $V_{ref}$ to drop slightly below the halfway value of $V_{cc}$. By way of illustration, where $V_{cc}$ is 5 volts, $V_{ref}$ will be approximately 2 volts. Moreover, because the control gate of device 156 is grounded, a bleed current is constantly drawn through device 156 to enhance the stability of $V_{ref}$ at voltage node 160.

Sensing section 150 of sense amplifier 124 comprises a voltage node 162 respectively connected to operating voltage supply line 158 through a depletion-mode device 164 arranged in pull-up configuration and to sense line 122 through a zero threshold device 166. A second zero-threshold device 168 is connected in parallel with depletion-mode device 164 between operating voltage supply line 158 and voltage node 162. The control gates of both zero-threshold devices 166 and 168 are connected to receive the reference potential $V_{ref}$ from voltage node 160 in the reference signal generator 148. As will be described shortly, depletion-mode device 164 serves as a current source for supplying read currents to an enabled $Y_i$ bit line during memory array read operations. Zero-threshold device 168 serves as a source of voltage for charging sense line 122 and the enabled $Y_i$ bit line, while zero-threshold device 166 functions as a transfer gate for clamping the voltage present on the sense line and for transferring read currents from depletion-mode device 164 to the enabled bit line. Because the current drawn through any individual storage device connected to the enabled $Y_i$ bit line is relatively small, depletion-mode device 164 must likewise be small if damage to the selected storage device is to be avoided during read operations. In contrast, the total number of storage devices connected to the enabled $Y_i$ bit line represents a cumulative bit line capacitance of relatively large magnitude, which bit line capacitance is subject to significant discharge or leakage as various word lines associated with the storage devices are enabled during previous memory array read operations. It can accordingly be seen that some means of rapidly charging sense line 122 and the enabled $Y_i$ bit line to an adequate potential at the outset of any given read operation is required if read times are to remain compatible with other memory array processing operations. For this reason, zero-threshold devices 166 and 168 are designed to handle significantly larger voltages than depletion-mode device 164.

When memory 2 is first activated, the reference potential $V_{ref}$ appearing at voltage node 160 in response to the powering-up of operating voltage supply line 158 causes zero-threshold devices 166 and 168 to begin conducting. As a consequence, the source voltage at both zero-threshold devices 166 and 168, and hence the voltage on sense line 122 and any enabled $Y_i$ bit line, rapidly increases. When the source voltages of the zero-threshold devices reach $V_{ref}$, that is, when the gate-to-source voltages of the devices reach zero, the devices stop conducting and the charging up of sense line 122 and the enabled $Y_i$ bit line is complete. Subsequent voltage discharges of the $Y_i$ bit line in response to the aforementioned enabling of word lines associated with the storage devices connected to the $Y_i$ bit line will be immediately reflected at the sources of the zero-threshold devices 166 and 168 when the $Y_i$ bit line is enabled in preparation for the next read operation, bringing the zero-threshold devices back into conduction to rapidly recharge the sense line 122 and the enabled $Y_i$ bit line.

Although the voltage on sense line 122 and any enabled $Y_i$ bit line connected thereto is effectively clamped at $V_{ref}$, the voltage at voltage node 162 can rise to the level of $V_{cc}$ due to the presence of depletion-mode device 164. During memory array read operations, if the selected storage device on the enabled $Y_i$ bit line is programmed, i.e., if a binary zero is stored in the selected storage device, no current will flow along the enabled $Y_i$ bit line and the voltage at voltage node 162 will stabilize at the $V_{cc}$ level. If, however, the selected memory device on the enabled $Y_i$ bit line is not programmed, i.e., if a binary one is stored in the selected memory device, current will flow through zero-threshold device 166 and sense line 122 into the enabled $Y_i$ bit line. Inasmuch as the voltage $V_{cc}$ at voltage node 162 is initially higher than $V_{ref}$, zero-threshold device 168 remains off and any current drawn through zero-threshold device 166 by the selected storage device must come from depletion-mode device 164. The voltage at voltage node 162 in turn drops below $V_{cc}$, ultimately reaching the level $V_{ref}$ at which zero-threshold device 168 conducts. The difference between $V_{cc}$ and $V_{ref}$ is sufficient to provide an indication of current flow through the selected storage device on the enabled $Y_i$ bit line. Thus, it is possible to ascertain the binary information written into the selected memory device by simply monitoring changes in the voltage at voltage node 162.

Inverting amplifier section 152 of sense amplifier 124 is designed to detect voltage shifts at voltage node 162, and for this purpose includes a series of three single-ended amplifier stages 170, 172 and 174. Amplifier stage 170 consists of depletion-mode device 176 connected in pull-up configuration between operating voltage supply line 158 and a voltage node 178 together with an enhancement-mode device 180 connected in pull-down configuration between voltage node 178 and ground. Similarly, amplifier stages 172 and 174 consist of depletion-mode devices 182 and 184 respectively connected between operating voltage supply line 158 and voltage nodes 186 and 188, while enhancement-mode devices 190 and 192 are respectively connected between voltage nodes 186 and 188 and ground. The control gate of enhancement-mode device 180 in amplifier stage 170 is connected to voltage node 162 in sensing section 150. Voltage node 178 in amplifier stage 170 is connected to the control gate of enhancement-mode device 190 in amplifier stage 172, voltage node 186 in amplifier stage 172 is connected to the control gate of enhancement-mode device 192 in amplifier stage 174, and voltage node 188 in amplifier stage 174 is connected to a data output lead 194.

When the voltage at voltage node 162 in the sensing section 150 of sense amplifier 124 is at $V_{cc}$, indicating that no current is flowing through the enabled $Y_i$ bit line, enhancement-mode device 180 is heavily gated on and the potential at voltage node 178 in amplifier stage 170 of inverting amplifier section 152 is pulled low. The low potential at voltage node 178 biases enhancement-mode device 190 off, whereupon the pull-up action of depletion-mode device 182 raises the voltage at voltage node 186 to $V_{cc}$ and enhancement-mode device 192 is gated into conduction. Voltage node 188 is then pulled low to provide a low DATA-OUT signal indicative of a programmed or binary zero state for the selected storage device on the $Y_i$ bit line. Conversely, where the selected storage device is unprogrammed, the resulting current flow through the $Y_i$ enabled bit line causes the voltage at voltage node 162 to drop. The gate drive of enhancement-mode device 180 in amplifier stage 170 likewise decreases to shut off device 180, permitting the pull-up action of depletion-mode device 176 to raise the voltage at voltage node 178 in amplifier stage 170. Enhancement-mode device 190 in amplifier stage 172 thereafter begins conducting to pull the voltage at voltage node 186 down, removing the gate drive from enhancement-mode device 192 in amplifier stage 174 and permitting the pull-up action of depletion-mode device 184 to raise the voltage at voltage node 188. As a net result, a high DATA-OUT signal indicative of a non-programmed or binary one state in the selected storage device is present on the data output lead 194. The DATA-OUT signal on the data output lead 194 may be supplied to the output section of input/output buffers 26 (not shown in FIG. 5) in memory array 2 and thence to the appropriate $0_i$ output pad 28 for use in data processing activities.

If desired, zero-threshold devices 196 and 198 may be respectively interposed between the depletion-mode devices 176 and 184 on either end of the inverting amplifier section 152. Zero-threshold devices 196 and 198 serve as power-down transistors for the sense amplifier 124. Both of the zero-threshold devices are gated by a CHIP ENABLE signal CE which is conventionally supplied to semiconductor memory array 2 for the purpose of activating the array. When the CE signal is low, indicating a power-down or non-use condition for memory array 2, zero-threshold devices 196 and 198 are gated off and depletion-mode devices 176 and 184 cannot conduct to raise the potential at voltage nodes 178 and 188. In this manner, power can be conserved when the memory array 2 is not in use. Of course, where the CE signal is high, indicating power-up or use conditions, zero-threshold devices 196 and 198 are gated into conduction and the voltage potential on operating voltage supply line 158 is made available to the depletion-mode devices 176 and 184 in preparation for sense amplifier operation.

The present invention has been set forth in the form of one preferred embodiment. It is nevertheless understood that various modifications to the sense amplifier circuitry disclosed above can be made by those skilled in the art without departing from the scope and spirit of the present invention. It is consequently the intention of the inventors to be limited only by the scope of the following claims and their equivalents.

We claim:

1. A sense amplifier apparatus for detecting the presence or absence of current flow through a device, which device is connected to an electrical conductor for periodically drawing current therefrom, said sense amplifier apparatus comprising:

a voltage node connectable to the electrical conductor;

a current source means connected to said voltage node for supplying the electrical conductor with current and for raising the voltage at said voltage node to a first predetermined voltage level, said current source means including a first transistor;

a voltage source means connected to said voltage node for charging the electrical conductor to a second predetermined voltage level less than said first predetermined voltage level, said voltage source means including a second transistor having a large current and voltage capacity relative to said first transistor; and a transfer means connected between said voltage node and the electrical conductor for clamping the voltage on the electrical conductor at said second predetermined voltage level and for permitting said current source means to raise the voltage at said voltage node to said first predetermined voltage level when current is not flowing through the device while permitting the voltage at said voltage node to drop to said second predetermined voltage level when current is flowing through the device, said transfer means including a third transistor having a large current and voltage capacity relative to said first transistor.

2. A sense amplifier apparatus as set forth in claim 1, wherein said second and third transistors both have control gates, said sense amplifier apparatus further including a reference signal generating means connected to said second and third transistors for supplying said control gates with a reference voltage which establishes said second predetermined voltage level on the electrical conductor.

3. A sense amplifier apparatus as set forth in claim 2, wherein said reference signal generating means includes a reference voltage node, an operating voltage supply, a fourth transistor connected between said reference voltage node and said operating voltage supply and a fifth transistor connected between said reference voltage node and ground.

4. A sense amplifier apparatus as set forth in claim 3, wherein said fourth and fifth transistors are both depletion-mode type transistors having grounded control gates.

5. A sense amplifier apparatus as set forth in claim 1, further including an amplifying means connected to said voltage node for sensing a voltage drop from said first predetermined voltage level to said second predetermined voltage level at said voltage node and for outputting a data signal in response thereto.

* * * * *